United States Patent [19]

Casper et al.

[11] Patent Number: 5,042,011
[45] Date of Patent: Aug. 20, 1991

[54] SENSE AMPLIFIER PULLDOWN DEVICE WITH TAILORED EDGE INPUT

[75] Inventors: Stephen L. Casper; Ward D. Parkinson, both of Boise, Id.

[73] Assignee: Micron Technology, Inc., Boise, Id.

[21] Appl. No.: 355,299

[22] Filed: May 22, 1989

[51] Int. Cl.$^5$ ............................ G11C 7/00; G11C 7/02
[52] U.S. Cl. .................................... 365/205; 365/206; 365/208; 307/530
[58] Field of Search ................. 365/189.11, 204, 205, 365/207, 208, 206; 307/530, 263, 443

[56] References Cited

U.S. PATENT DOCUMENTS

| | | | |
|---|---|---|---|
| 4,000,413 | 12/1976 | Wong et al. | 307/530 |
| 4,551,641 | 11/1985 | Pelley, III | 365/205 |
| 4,791,613 | 12/1988 | Hardee | 365/190 |

FOREIGN PATENT DOCUMENTS 0308790  12/1988  Japan ................................. 365/205

Primary Examiner—Stuart N. Hecker
Assistant Examiner—Jack A. Lane
Attorney, Agent, or Firm—Stanley N. Protigal

[57] ABSTRACT

A tailored edge rate triggers a pulldown device which turns on a sense amplifier in a memory array to sense and amplify a voltage difference between two digit lines, facilitating a memory cell read operation. The tailored edge rate activates the pulldown device slowly at first, then quickly saturates it, to allow transistors in the sense amplifier to activate and quickly sense the digit lines without bouncing same.

6 Claims, 4 Drawing Sheets

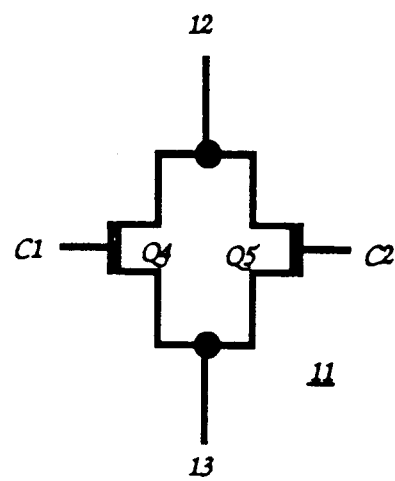
FIG. 2 -- PRIOR ART
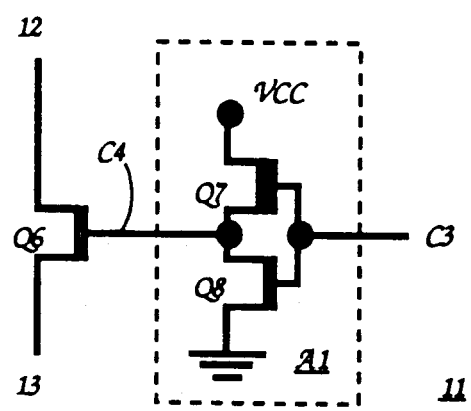
FIG. 3

*FIG. 4 -- PRIOR ART*

SENSE AMPLIFIER PULLDOWN DEVICE WITH TAILORED EDGE INPUT

FIELD OF THE INVENTION

This invention relates to semiconductor circuit devices and more particularly to circuitry for charging sense lines on semiconductor integrated circuit devices which use a grounded p-substrate or p-well. In the circuit, a node is rapidly pulled from a high potential (approximating VCC/2 or VCC) to a reference potential (VREF), without introduction of noise to said node. The invention is particularly applicable to dynamic random access memory devices (DRAMs).

BACKGROUND OF THE INVENTION

The invention uses various materials which are electrically either conductive, insulative or semiconductive, although the completed semiconductor circuit device itself is usually referred to as a "semiconductor", generally made of silicon and related materials.

In the operation of certain semiconductor circuit devices, such as DRAMs, a sense amp detects and amplifies a very small charge or the absence thereof in a memory cell. For example, a charged memory cell is discharged, via an activated WORD line, to a DIGIT line (refer to FIG. 1). DIGIT and its corresponding DIGIT* line are initially equilibrated to voltage VEQ (which may be approximately VCC or VCC/2), and each connect to opposite sides of the sense amp. A common node of the sense amp transistors is also initialized to VEQ. This cell-to-DIGIT discharge slightly raises DIGIT voltage to VEQ + dV, while DIGIT* remains at VEQ, causing voltage difference dV between DIGIT and DIGIT*. Within the sense amp is a pulldown device that turns on the sense amp by pulling down the common node to VREF. In this example, with DIGIT higher than DIGIT*, the sense amp transistor gated by DIGIT will turn on faster than the sense amp transistor gated by DIGIT* as the common node is pulled down. The transistor gated by DIGIT pulls DIGIT* from VEQ to VREF, while DIGIT remains at approximately VEQ + dV.

Similarly, if the memory cell initially has nr charge, the DIGIT-to-cell discharge slightly decreases DIGIT to VEQ - dV, while DIGIT* remains at VEQ. In this case, when the sense amp is turned on, DIGIT is pulled down to VREF while DIGIT* remains approximately at VEQ.

In both cases above, a very small voltage difference dV between DIGIT and DIGIT* is sensed and amplified by the sense amplifier. After this sense operation, DIGIT and DIGIT* can easily drive less sensitive circuitry. Also in both cases, actual turn-on of the sense amp occurs when the common node is approximately one VT (transistor threshold voltage) below DIGIT or DIGIT* (whichever is highest).

High speed is desirable in such a device, because the sense amp pulldown time controls the time required to read a memory cell, consequently controlling the access speed of the DRAM. This speed can be increased by pulling down the common node very quickly. However, a problem arises if the pulldown is too quick, because capacitive coupling between the sources and drains of the sense amp transistors tends to pull both DIGIT and DIGIT* down before the common node is pulled down low enough to turn on one of the transistors. In this case, as the sense amp transistor finally turns on, it shorts out its capacitive coupling and bounces DIGIT and DIGIT*. This noise is undesirable.

One way to quickly pull down the common node while avoiding this noise is to slowly pull down the common node until one of the sense amp transistors turns on, then quickly pull down the common node the rest of the way. One well known combination (shown in FIG. 2) is two sequentially clocked pulldown transistors on the common node. The first pulldown transistor clocked has a low gain, thereby providing a slow pulldown on the common node (see FIG. 4, time T1). The second pulldown transistor clocked has a high gain, quickly pulling down the common node the rest of the way FIG. 4, time T3).

It is desirable to perform this type of pulldown using only one pulldown transistor and clock instead of two.

SUMMARY OF THE INVENTION

In accordance with the present invention, a single pulldown transistor is provided for use in a sense amp. The transistor has high gain, and is turned on by a signal having a slow low-to-high edge rate, which is tuned ('tailored') by adjusting the size (and consequently strength) of a pullup device in an inverter generating said edge. In use, the pulldown transistor turns on slowly, then quickly enters into saturation. Consequently, the sense amp common node is pulled down slowly, then quickly. The edge rate is tailored to the particular sense amp so that the quick part of pulldown occurs close to the time that one of the sense amp transistors begins to turn on.

An advantage of the invention is that the sense amp can be made smaller. Another advantage is that only one signal is needed to turn on the sense amp instead of two.

BRIEF DESCRIPTION OF THE DRAWINGS

FIG. 2 details a prior art pulldown.

FIG. 3 details a pulldown in accordance with the invention.

DETAILED DESCRIPTION OF THE PREFERRED EMBODIMENT

Figure 1:
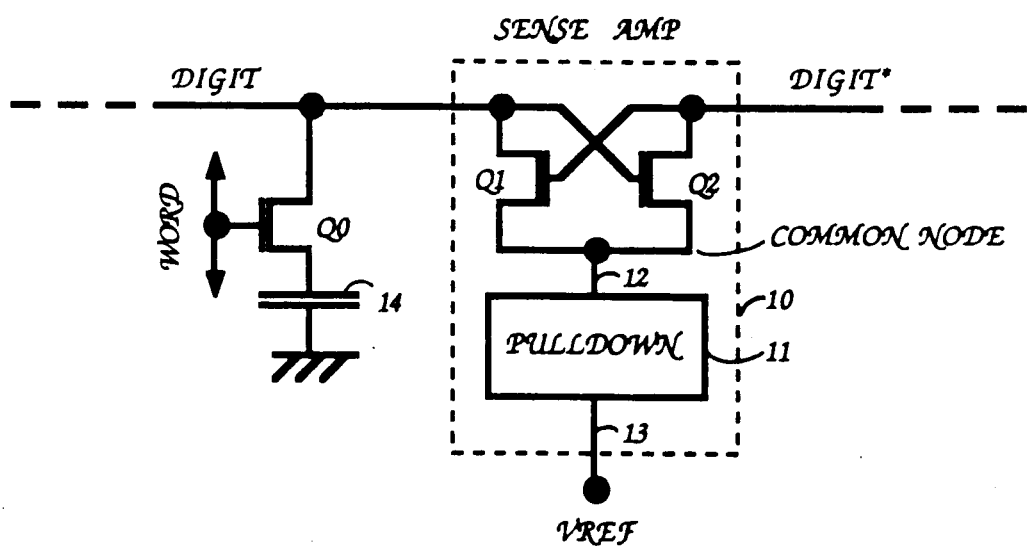
FIG. 1 shows an n-channel sense amp and generic pulldown, with associated DIGIT and DIGIT* lines and a representative memory cell.
Figure 4:
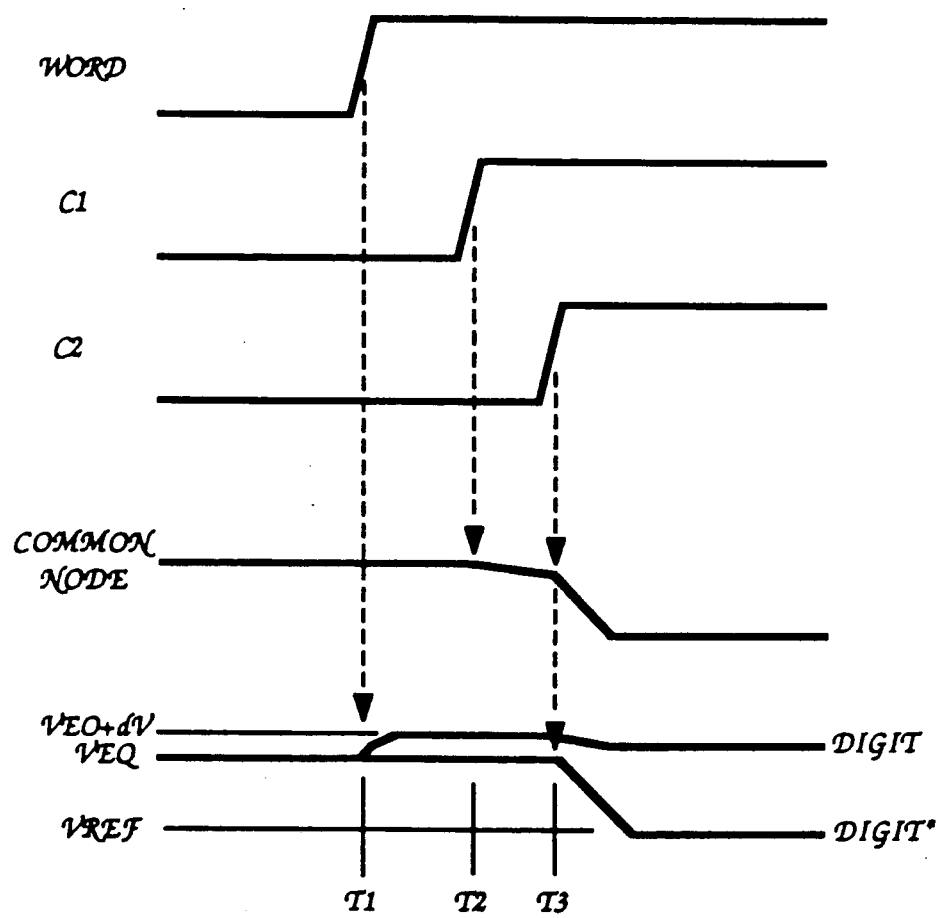
FIG. 4 is a graph, depicting voltage transitions during operation of the prior art pulldown detailed in FIG. 2.

As shown in FIG. 1, a sense amp 10 includes cross-coupled n-channel transistors Q1 and Q2, and switched pulldown 11, all combined for sensing and amplifying a voltage difference between DIGIT and DIGIT*, caused by shorting a memory cell 14 to DIGIT or DIGIT* via access transistor Q0. The sources of Q1 and Q2 are connected to a common node, and the gate of each is connected to the other's drain. The gate of Q1 connects to DIGIT* and the gate of Q2 connects to DIGIT.

While circuit elements are shown and described, in the preferred embodiment each of these circuit elements is formed as a part of a semiconductor circuit chip. The described circuit functions find particular utility when integrated onto the chip, although it is possible to utilize the invention as one or more separate circuit elements.

Pulldown 11, detailed in FIG. 3, includes n-channel pulldown transistor Q6, driven by CMOS inverter A1. A1 includes p-channel transistor Q7 and n-channel transistor Q8. Q7 is weak in comparison with Q8, being about 0.8 times the size of Q8 (a normal size for Q7 in this type of inverter is about 1.5 times the size of Q8).

Figure 5:
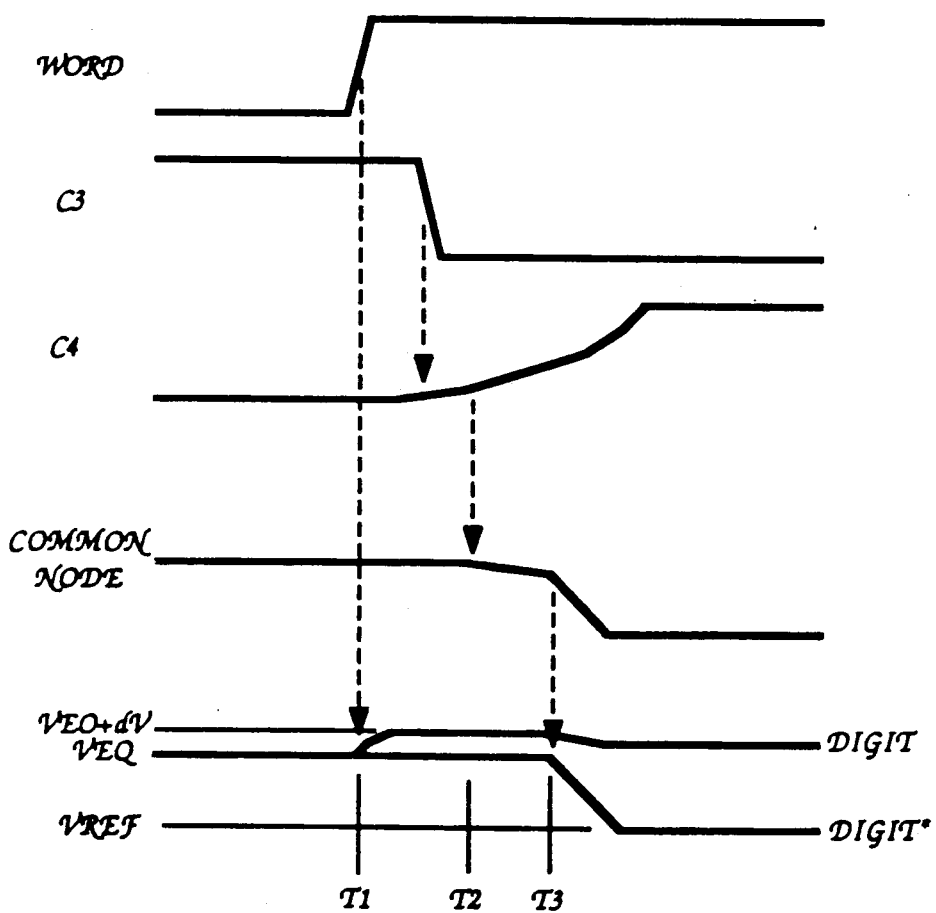
FIG. 5 is a graph, depicting voltage transitions during operation of the inventive pulldown detailed in FIG. 3.

In operation, as graphed in FIG. 5, WORD activates access transistor Q0 at time T1, shorting cell 14 to DIGIT. For the sake of this description, assume cell 14 contained charge, causing DIGIT voltage to slightly increase, from VEQ to VEQ + dV. Signal C3 then undergoes a high to low transition, causing inverter A1 to output a rising edge on signal C4, gating Q6. Q7 is weaker than Q8, so the rising edge of C4 is relatively slow, or 'tailored'. This makes Q6 slowly turn on at time T2, causing a slow pulldown on the common node. Q6 is large enough to carry all current that the common node supplies when sense amp 10 is fully on, thus causing a faster drop on the common node at time T3.

In the case above, cell 14 originally contained a charge. During the operation of the preferred embodiment, DIGIT* was pulled from VEQ to VREF, while DIGIT remained at approximately VEQ + dV. Similarly, if cell 14 had originally contained no charge, DIGIT would have been pulled from VEQ − dV to VREF, while DIGIT* would have remained at approximately VEQ.

While the invention has been described in terms of a DRAM, the circuit has utility in other circuits where it is desired to initially slowly pull down a voltage and then rapidly pull down the voltage further.

We claim:

1. A semiconductor device, comprising:
   a CMOS inverter responsive to an input signal, having a pullup to pulldown device size ratio of about 0.8, so that said CMOS inverter, in response to said input signal generates an inverter output signal having a tailored edge rate;
   b) the inverter including means for generating the inverter output signal, such that the inverter output signal has a low-to-high edge rate such that a transistor device gated on by the output signal is gated on by a rising edge of the inverter inverter output signal and turns on slowly, then quickly enters into saturation;
   c) a pulldown transistor to pull down a common node, gated by said inverter output signal, its first terminal connected to said common node and its second terminal connected to a low reference potential, so that said pulldown transistor, in r sponse to said tailored edge rate, turns on slowly and then quickly saturates, thereby pulling down said common node slowly at first, then quickly; and
   d) said pulldown transistor being gated by the inverter output signal, so that the pulldown transistor in response to said tailored edge rate, turns on slowly and then quickly saturates, thereby causing a faster drop on the common node without bouncing the common node;
   e) first and second transistors, each transistor having at least two terminals and a gate, each gate being connected to a first terminal other than the gate of the other of the first and second transistors, said first terminal of said first transistor connected to the first sense node, said first terminal of said second transistor connected to the second sense node, each transistor's remaining terminal connected to said common node, so that in response to said output signal having said tailored edge rate, said first and second transistors quickly sense and amplify a difference in potential between said first and second sense nodes without bouncing the first and second sense nodes.

2. The semiconductor device of claim 1, wherein said first and second sense nodes are digit lines in a memory circuit.

3. The semiconductor device of claim 1, wherein said first and second sense nodes are digit lines in a DRAM device.

4. A semiconductor memory device having an array of memory cells, comprising:
   a) at least one pair of digit lines;
   b) access transistors to selectively connect the memory cells to at least one of said digit lines;
   c) a common node;
   d) a pair of transistors, each transistor having at least two terminals and a gate, each gate being connected to a first terminal other than the gate, of the other of the first and second transistors, said first terminal of each transistor connected to one digit line, each transistor's remaining terminal connected to said common node;
   e) a CMOS inverter responsive to a first signal, having a pullup to pulldown device size ratio of about 0.8, and a common gate, so that said CMOS inverter, in response to said first signal, outputs a second signal having a tailored edge rate, the second signal having a low-to-high edge rate such that a transistor device gated on by the second signal is gated on by a rising edge of the second signal and turns on slowly, then quickly enters into saturation; and
   f) a pulldown transistor, gated by said second signal, its first terminal connected to said common node and its second terminal connected to a low reference potential, so that said pulldown transistor, in response to said tailored edge rate, turns on slowly to activate at least one transistor of said pair of transistors and then quickly saturates, allowing said transistor pair to quickly sense and amplify a difference in potentials of said pair of digit lines without bouncing the same.

5. The semiconductor device of claim 4, wherein the memory cells are dynamic.

6. A sense amplifier, to sense and amplify a difference in potential between first and second sense nodes, comprising:
   a) a common node;
   b) means to provide a first signal, said means including a commonly gated n-channel transistor and p-channel transistor which have a device size ratio such that the n-channel and p-channel transistors a tailored edge rate which decreases slowly and then decreases more quickly;
   c) first and second transistors, each transistor having at least two terminals and generate gate, each gate being connected to a first terminal other than the gate, of the other of the first and second transistors, said first terminal of said first transistor connected to the first sense node, said first terminal of said second transistor connected to the second sense node, each transistor's remaining terminal connected to said common node;
   d) a pulldown transistor, gated by the first signal, its first terminal connected to said common node and its second terminal connected to a low reference potential; and e) said tailored edge rate resulting in said pulldown transistor, in response to said tailored edge rate, turning on slowly to activate at least one of said first and second transistors and then quickly saturates, allowing said first and second transistors to quickly sense and amplify the difference in potential between the first and second sense nodes without bouncing the same.

* * * * *